US006246708B1

(12) United States Patent
Thornton et al.

(10) Patent No.: US 6,246,708 B1
(45) Date of Patent: Jun. 12, 2001

(54) SEMICONDUCTOR LASER WITH ASSOCIATED ELECTRONIC COMPONENTS INTEGRALLY FORMED THEREWITH

(75) Inventors: Robert L. Thornton, Los Altos; Robert A. Street, Palo Alto, both of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 08/921,935

(22) Filed: Aug. 27, 1997

(51) Int. Cl.[7] .............................. H01S 5/206; H01S 5/183
(52) U.S. Cl. ................................................ 372/50; 372/96
(58) Field of Search .................................. 372/50, 96, 45, 372/33, 46

(56) References Cited

U.S. PATENT DOCUMENTS

| 5,017,989 | 5/1991 | Street et al. | 257/291 |
| 5,079,426 | 1/1992 | Antonuk et al. | 250/370.09 |
| 5,216,263 | 6/1993 | Paoli | 257/88 |
| 5,216,686 | * 6/1993 | Holm et al. | 372/45 |
| 5,266,794 | * 11/1993 | Olbright et al. | 250/214 LS |
| 5,283,447 | * 2/1994 | Olbright et al. | 257/85 |

(List continued on next page.)

FOREIGN PATENT DOCUMENTS

| 04249368 | 9/1992 | (JP) . |
| 09199795 | 7/1997 | (JP) . |
| WO 95/26051 | 9/1995 | (WO) . |

OTHER PUBLICATIONS

H. Fathollahnejad et al, The Integration of GAAS Vertical–Cavity Surface Emitting Lasers Onto Silicon Circuitry, Proceedings of the IEEE/Cornell Conference on Advanced Concepts in High Speed Semiconductor Devices and Circuits, Ithaca, New York, Aug. 7–9, 1995, *Institute of Electrical and Electronics Engineers*, Aug. 7, 1995, pp. 373–381.

Y. J. Yang et al, Monolithic Integration of a Vertical Cavity Surface Emitting Laser and a Metal Semiconductor Field Effect Transistor, *Applied Physics Letters*, vol. 62, No. 6, Feb. 8, 1993, pp. 600–602.

Hasnain et al., Monolithic Integration of Photodetector with Vertical Cavity Surface Emitting Laser, Electronics Letters, vol. 27, No. 18, Aug. 28, 1991, pp. 1630 et seq.

Jewel et al., Vertical–Cavity Surface–Emitting Lasers: Design, Growth, Fabrication, Characterization, IEEE J. Quantum Electronics, vol. 27, No. 6, Jun. 1991, pp. 1332 et seq.

Morgan et al., 200° C, 96–nm Wavelength Range, Continuous–Wave Lasing From Unbonded GaAs MOVPE–Grown Vertical Cavity Surface–Emitting Lasers, IEEE Photonics Tech. Let., vol. 7, No. 5, May 1995, pp. 441 et seq.

Morgan et al., Transverse Mode Control of Vertical–Cavity Top–Surface–Emitting Lasers, IEEE Photonics Tech. Let., vol. 4, No. 4, Apr. 1993, pp. 374 et seq.

Tell, et al., High–Power CW Vertical–Cavity Top Surface–Emitting GaAs Quantum Well Lasers, Appl. Phys. Lett. vol. 57, No. 18, Oct. 29, 1990, pp. 1855 et seq.

*Primary Examiner*—James W. Davie

(57) ABSTRACT

A vertical cavity surface emitting laser (VCSEL) of types otherwise known is provided with integrated electronics. The integrated electronics may be, for example, transistors. Other electronic elements may also be integrally formed with the VCSEL. Also integrally formed with the VCSEL may be a detector for detecting light emitted by the VCSEL. The electronics and/or detector may be of hydrogenated amorphous silicon (a-Si:H). The detector may have transparent contacts, of for example of indium tin oxide (ITO), formed by techniques otherwise known. Improved, on-chip addressing is possible, and improved detector architecture is provided.

17 Claims, 12 Drawing Sheets

U.S. PATENT DOCUMENTS

| | | | |
|---|---|---|---|
| 5,408,105 | 4/1995 | Adachi et al. | 257/13 |
| 5,606,572 | 2/1997 | Swirhun et al. | 372/96 |
| 5,677,924 * | 10/1997 | Bestwick | 372/46 |
| 5,742,630 | 4/1998 | Jiang et al. | 372/50 |
| 5,751,757 | 5/1998 | Jiang et al. | 372/50 |
| 5,757,027 * | 5/1998 | Kuchta | 372/50 |
| 5,757,829 * | 5/1998 | Jiang et al. | 372/33 |
| 5,822,351 | 10/1998 | Kang | 372/50 |
| 5,943,357 * | 8/1999 | Lebby et al. | 372/50 |

* cited by examiner

SEMICONDUCTOR LASER WITH ASSOCIATED ELECTRONIC COMPONENTS INTEGRALLY FORMED THEREWITH

CROSS-REFERENCE TO RELATED APPLICATIONS

The subject matter described and claimed herein is related to the subject matter described and claimed in U.S. patent application Ser. No. 08/921,942 now abandoned, which is incorporated herein by reference.

STATEMENT AS TO RIGHTS TO INVENTIONS MADE UNDER FEDERALLY SPONSORED RESEARCH AND DEVELOPMENT

A portion of this work was done under ARPA grant F19628-94-C-0023.

BACKGROUND

The present invention relates to semiconductor lasers. More specifically, the present invention relates to semiconductor lasers having associated electronic components integrally formed therewith.

Semiconductor lasers are important devices used in a variety of applications including printing, scanning, communications, etc. Semiconductor lasers generally fall into two categories: edge-emitting and vertical cavity surface emitting (VCSEL). Each of these types of devices are well known. In an edge emitting semiconductor laser structure, a number of layers are deposited onto a substrate. Following deposition, the edges of the structure are cleaved to form partially transmissive mirrors. One or more of the deposited layers forms an optical cavity, bound at its edges by the mirrors. Lasing occurs within the cavity between the mirrors, and the laser beam exits at one or both of the edges of the laser structure in a direction parallel to the plane of the layers.

Surface emitting lasers are similar in concept, but differ in that the laser beam is emitted orthogonal to the plane of the active layer(s). The mirrors are above and below the optical cavity, as opposed to at each edge of the cavity. For certain applications, a surface emitting laser provides advantages over an edge emitting laser. For example, 2-dimensional arrays of vertical cavity lasers may be produced in wafer form, whereas edge emitting lasers typically must be mechanically jointed to form such arrays. Also, surface emitting lasers typically emit circularly symmetric Gaussian beams, as compared to highly eccentric elliptical beams of edge emitting lasers. Accordingly, today there is much interest and development centered around surface emitting lasers.

Associated with any semiconductor laser are numerous electronic components. For example, the power of a laser is typically controlled by the drive current applied to its electrodes; and one or more electronic components such as transistors, capacitors, diodes, etc. forming drive circuitry may be employed to control the drive current. As another example, components such as transistors are often employed in addressing circuitry for addressing individual lasers in arrays of such devices.

More specifically, in arrays of lasers, it is desirable to be able to independently address each laser. This becomes problematic when dealing with large arrays of such lasers. In such large arrays, the small size and large density of the electrodes to which connection must be made increase the complexity of making connections. Furthermore, the need to produce small size arrays limits the surface area which addressing connections and circuitry are permitted to occupy. To produce such arrays within a practical cost structure, the addressing circuitry and scheme must be relatively simple. Finally, the addressing circuitry and scheme must support rapid addressing of each laser.

While there are many examples of addressing circuitry and schemes in the art, efforts to date have not been successful in producing VCSELs having integrated (i.e., formed either as part of the process of forming the VCSEL or formed above the VCSEL as part of subsequent processing) associated electronic component structures. Rather, addressing circuitry, as well as driver circuitry and other related components, have been built external to the laser structure itself, then interconnected for operation.

For example, FIG. 1 is an illustration of a laser structure and separately connected voltage source 10. Laser 12 is formed on a substrate 14, typically GaAs. A number of thin layers are first deposited to form a lower mirror region 16, an n-type layer 18 is formed on lower mirror 16, an intrinsic active layer 20 is formed on n-type layer 18, a p-type layer 22 is formed on intrinsic active layer 20, and an upper mirror layer 24 is formed on p-type layer 22. Typically, a metal, n-material electrode 26 is formed below the substrate 14, and a metal, p-material electrode 28 is formed above the upper mirror region 18. Electrode 28 is typically annular in planform, so as to maximize surface contact yet minimize interference with the laser beam $B_1$ generated by the structure.

A voltage is then applied to electrode 28 from external voltage supply 30 and addressing circuitry 32. Electrode 26 is typically connected to ground potential. The current through the laser 12 results in the generation of laser beam $B_1$. The requirement of external voltage supply, addressing circuitry, and potentially other electronic components associated with laser 12 limits the ability to reduce size, cost, component complexity, etc., and increase speed, efficiency, etc.

In addition, in many laser systems it is necessary to measure and control the power of the beam emitted by the laser. For example, it is necessary in many applications to provide a constant, predetermined beam power, which requires compensation for the laser's temperature, aging, etc. Beam power detection generally involves interposing a detector in a laser beam path. In the case of certain edge emitting lasers, this may be accomplished by detecting one of two beams. That is, where an edge emitting laser is of the type having two beam emissions, one from each edge (facets), one beam is referred to as a forward emission beam and the other as a rear emission beam. The forward emission beam will generally be of a higher power than the rear emission beam. Hence, the forward emission beam is generally the operable beam performing the desired function, such as writing to a photoreceptor, pulsing encoded signals to a transmission line, cutting material, etc., while the rear emission beam is often not used. However, the ratio of the power of the forward emission beam to the power of the rear emission beam can be measured. Thus, by placing a detector in the path of the rear emission beam, and by employing the aforementioned power ratio, the power of the forward emission beam may be determined.

This approach has limited utility for surface emitting laser structures, for several reasons. Typically, surface emitting laser structures include a gallium arsenide (GaAs) substrate, which is opaque for wavelengths shorter than 870 nm. Thus, for most applications, the substrate will be opaque, and the laser structure will be capable of producing only a single, surface emitted laser beam. Second, in general it is desirable to provide as high a beam power as possible, so it is a design goal to produce single beam laser structures.

An existing approach to incorporating a detector into a single beam surface emitting laser (assumed to be single beam herein, unless otherwise stated) is to form the detector in the laser structure. That is, additional layers would be epitaxially grown above the laser structure, but of the same material as the laser structure, which would be appropriately patterned and/or doped, and interconnected to form a detector. The detector is generally coaxial with the laser beam, and relies on partial absorption of the beam to create electron-hole pairs which are detected by methods otherwise known in the art.

The upper detector electrode will have an inside diameter d, which is at its smallest equal to the diameter of the laser beam generated by the underlying laser. In operation, the detector converts photon energy from the laser beam to electron-hole pairs, which migrate to respective electrodes. Beam power is thus measured by measuring the extent of electron-hole pair generation (i.e., current generated in the detector). The speed of the detector is measured by the speed at which the electrons or holes travel to their respective electrodes. Those electrons or holes generated at the center of the annular detector electrode must travel a distance equal to at least d/2. This is a relatively large distance, and results in relatively slow detection.

Third, the detector is essentially a p-i-n photodiode. The detector's p- and n-type layers are formed of GaAs, a material opaque to the laser beam when the combined thickness of the layers is 1000 Å or greater (again, assuming a laser wavelength shorter than 879 nm). Typically, a design point for absorption of the beam by the detector is around 5% of the beam's energy. However, if the layers are too thin, they will be too transparent, and not absorb sufficient photon energy to effectively serve as a detector. Thus, to obtain the desired performance from the detector, it is necessary to very precisely control the thicknesses of the p- and n-type layers, which adds to the cost and complexity of manufacture.

Whether circuitry or detector, it should be possible to tailor the thickness of the layers formed above the VCSEL to "tune" the interference of the reflected portions of the laser beam. This would provide improved efficiency and performance of the laser. However, to accomplish this, some flexibility to adjust layer thicknesses is required, which the constraints of the GaAs layers cannot provide.

In this regard, it becomes necessary to effect modifications to the laser itself to account for the additional layers at the VCSEL's surface. For example, the only way to compensate for destructive reflections from such additional layers is to adjust the thicknesses of the various laser structure layers, such as the thickness of the lower mirror layer, part of which serves as the lower mirror below the optical cavity. This constrains optimizing the laser structure design for peak laser performance.

Furthermore, there is no teaching in the art of an integrated VCSEL, sensor, and associated electronic components. According to all heretofore known techniques, such integration would significantly increase the complexity and cost of manufacturing the laser structure. In addition, the size and position limitations for the various contacts, due to their being opaque, mean that an extensive network of interconnections would be required, limiting the compaction of laser structures desired of arrays of such structures.

Consequently, the currently accepted approach for connecting laser structures with associated electronic components is to connect such structures to external circuitry. This implies a sacrifice of speed, compactness, and system complexity which the present invention strives to overcome.

In fact conventional electronics used in conjunction with VCSELs are virtually exclusively formed of single crystal silicon. However, single crystal electronics must be formed over a single crystal substrate, and thus the forming such electronics on or together with a VCSEL is very difficult if not impossible.

SUMMARY OF THE INVENTION

The present invention is a process and structure which address the shortcomings of the prior techniques of integrating a laser structure and associated electronic components. As used herein, an "electronic component" is any device capable of carrying, modifying, storing, generating or otherwise interacting with an electrical signal. Also as used herein, an electronic component is "associated" with the laser if it is either directly or indirectly in electrical, optical or thermal communication with the laser. According to one embodiment of the present invention, a VCSEL structure is provided with matrix addressing circuitry, in the form of transistor elements, allowing addressing of that laser structure. The VCSEL structure may be a stand-alone laser, or may be one of a number of such laser structures forming an array of such devices, with the associated circuitry for addressing individual ones of the lasers forming the array.

According to one embodiment, the transistor structures are provided in layers deposited over the layers in which said laser structure is formed. Also according to one embodiment of the present invention, the channel layer(s) of such transistor structures are formed of hydrogenated amorphous silicon (a-Si:H). According to still another embodiment, the channel layer(s) of one or more of such transistor structures are formed of polycrystalline silicon (polysilicon).

In addition to the formation of transistor structures, other circuitry such as capacitors, resistors, diodes, etc. may be integrally formed over the laser structures to accomplish desired functionality. For example, the matrix addressing scheme of one embodiment of the present invention benefits from the integral formation of one or more capacitors with the formation of the transistor structures.

Furthermore, in cases where an integrated detector structure is desirable, the laser structure is provided at its output surface with a p-i-n photodiode sandwiched between transparent electrode layers, for example formed of indium tin oxide (ITO). The p-material electrode of the detector may be common with the p-material electrode of the surface emitting laser, or may be a separate electrode.

Formed at least in part in the same layers as the detector structure is one or more associated electronic components, such as transistors. Such integrated transistors provide, for example, on-chip matrix addressing of either or both the laser structure and sensor structure. However, provided the ability to integrally form arbitrary circuitry with the VCSEL structure, virtually any application of such circuitry in conjunction with the laser and/or sensor structures may be enabled by the present invention.

According to a process comprising one embodiment of the present invention, a VCSEL structure is formed by processes otherwise well known in the art. One or more associated electronic components, such as transistors, are formed directly thereupon at low temperatures, and in a manner that otherwise does not adversely affect the performance of the laser structure.

According to another embodiment of the present invention, a detector structure is deposited directly upon the VCSEL structure together with transistors, at low temperatures, and in a manner that otherwise does not adversely affect the performance of the VCSEL. Alternatively, the detector structure may be formed on a glass, quartz or similarly transparent substrate, then subsequently bonded to the VCSEUintegral transistor structure. The bonding process and materials selected are benign to the structure and operation of the laser, transistor, and detector structures.

The shortcomings of the prior techniques are addressed since no additional photolithography of the GaAs structure is required. Any deposition, exposure, etching, etc., required to fabricate the associated electronic components and/or detector structure takes place subsequent to and separate from the processing of the laser structure. And, as mentioned, the processes involved in fabricating the transistor and/or detector structure may be benign to the underlying surface emitting laser structure.

Finally, the characteristics of a-Si:H and polysilicon circuitry arrays have been studied for some time, and the benefits of these studies may be employed in the integrated structures according to the present invention.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

Figure 1:
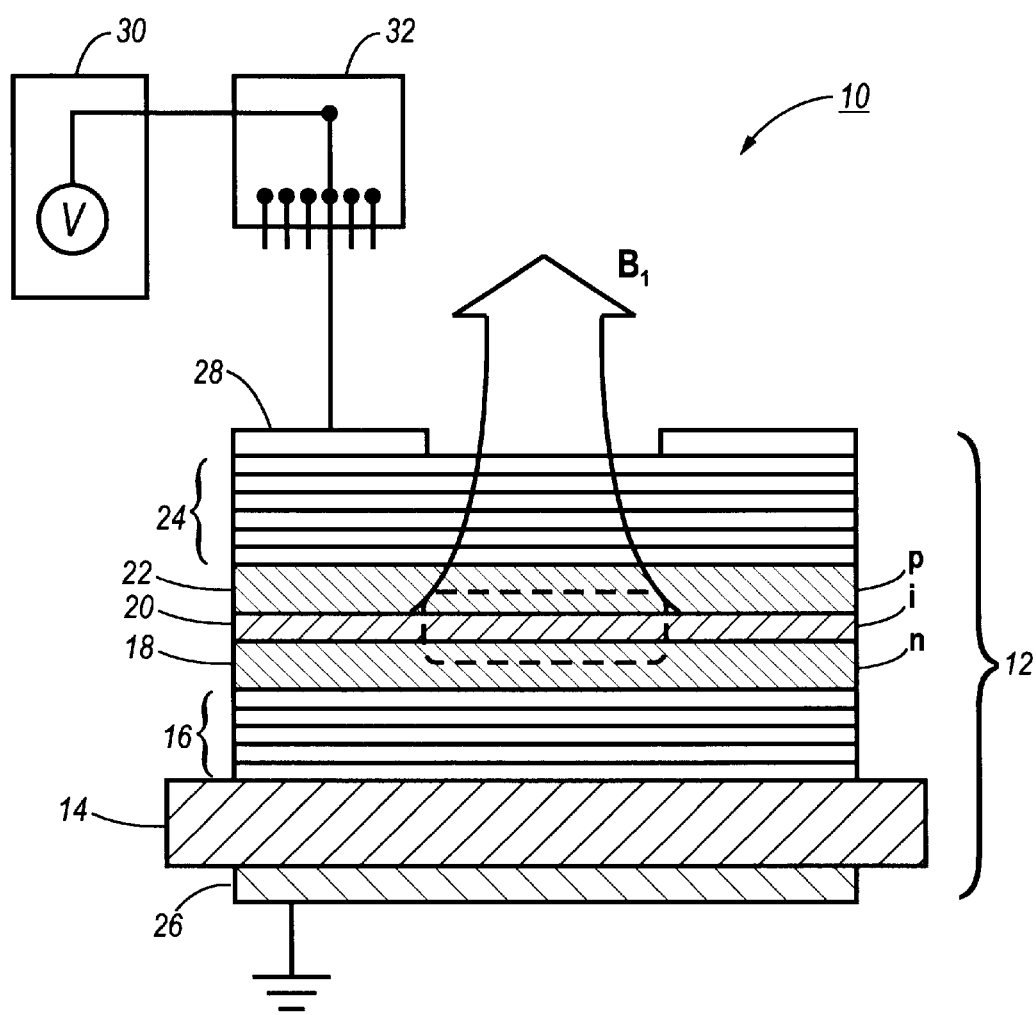
FIG. 1 is a perspective view of a vertical cavity surface emitting laser structure with external circuitry according to the prior art.

An integrated surface emitting laser and associated electronic components 50 according to one embodiment of the present invention shall now be described with reference to FIG. 2. According to the present embodiment, the associated electronic components are thin-film transistors. This, however, is only one example illustrating the concepts of the present invention, and shall not limit the scope of the invention disclosed herein.

A fundamental component of the present invention is the vertical cavity surface emitting laser (VCSEL) structure 52. As illustrated in FIG. 2, VCSEL 52 includes a substrate 54, for example n-type gallium arsenide (GaAs). The doping of the GaAs substrate 54 may typically be in the range of $5 \times 10^{18}$ cm$^{-3}$. Formed on or below a first side of substrate 54 is first electrode layer 56. Typically, this first electrode layer 56 is an n-type material, such as an alloy of germanium and gold (GeAu).

Formed on or over a second side of substrate 54 is mirror structure 58. Mirror structure 58 (as well as other mirror structures described herein) may be a super lattice of multiple thin layers, or other type structure forming a distributed Bragg reflector ("DBR"). A buffer layer of about 200 to 800 nm, which is not shown in FIG. 2, may be first formed on substrate 54 so that it lies between substrate 54 and mirror structure 58. This lower mirror structure 58 provides part of the necessary internal reflection required to form the VCSEL.

Lower mirror structure 58 typically comprises multiple high and low aluminum content aluminum gallium arsenide (AlGaAs) or aluminum arsenide (AlAs) alloy layer pairs. Each of these layers have an aluminum content, in the range of 0% to 15% for the low aluminum layers, and in the range of 85% to 100% for the high aluminum layers, controlled so that they achieve a desired refractive index in each layer. A typical target refractive index for the high aluminum content layer is around 3.1 to 3.2, and the target refractive index for the low aluminum content layer is around 3.5 to 3.6. The aluminum content of these layers must also be controlled to render them non-absorptive at the lasing wavelength. The uppermost layer of the lower mirror structure is a typically a high aluminum content layer.

The target total thickness of each of the layer pairs is one half of the optical wavelength at the desired laser operation wavelength. The target thickness of the uppermost layer of the lower mirror structure 58 is one quarter of the optical wavelength at the desired laser operation wavelength. A typical laser operation wavelength is 820 nm.

Since the laser output is outcoupled through only one surface (the upper surface) of the VCSEL, high internal reflection will maximize the laser output. High internal reflection also generally reduces the required threshold current of the laser. Thus, the reflectivity of the lower mirror structure 58 should be as close to 100% as possible. It is well-known that the reflectivity of the lower mirror structure 58 is, in part, a function of the difference in the refractive indices between the high and low aluminum content layers. The reflectivity is also a function of the number of layer pairs in the structure. The greater the difference in the refractive indices, the fewer number of layer pairs are required to reach a given reflectivity. Typically, 20 to 40 pairs of high and low layers are used to form the lower mirror structure 58. Lower mirror structure 58 will generally be doped so as to be of n-type material. Silicon is a common material with which lower mirror structure 58 may be doped to render it n-type.

Formed on or over mirror structure 58 is first spacer layer 60. Spacer layer 60 is typically formed of AlGaAs with an aluminum content of about 40%, and a thickness of about 100 nm. First spacer layer 60 may be doped with silicon, selenium, tellurium, etc. to a concentration of about 1 to $3 \times 10^{18}$ cm$^{-3}$. Generally, the uppermost 20 nm of first spacer layer 60 remains undoped.

On or over first spacer layer 60 is active layer 62. Active layer 62 may be a single quantum well structure formed of GaAs or p- or n-doped GaAs or $Al_zGa_{1-z}As$, where z is very small, $(Al_zGa_{1-z})_{0.5}In_{0.5}P$. Alternatively, active layer 62 may be a relatively thin conventional double heterostructure (DH) structure, a multiple quantum well structure, such as alternating layers of materials such as GaAs and $Al_zGa_{1-z}As$, or one of many other known structures for active layers of semiconductor lasers. It is the material comprising active layer 62 which is defined herein as the material of which VCSEL 52 is predominantly comprised.

On or over active layer 62 is second spacer layer 64. As with first spacer layer 60, second spacer layer 64 is typically formed of AlGaAs with an aluminum content of about 40%, and a thickness of about 100 nm. Second spacer layer 64 may be doped with magnesium, carbon, zinc, etc. to a concentration of about 1 to $3 \times 10^{18}$ cm$^{-3}$. Generally, the lowermost 20 nm of first spacer layer 64 remains undoped. First spacer layer 60, active layer 62, and second spacer layer 64 together form the optical cavity 66 in which the desired optical gain is achieved. The combined optical thickness of the layers comprising this optical cavity is optimally equal to an integral multiple of half of the optical wavelength in the cavity.

On or above second spacer layer 64 is upper mirror structure 68. Upper mirror structure 68 forms another DBR mirror, and is structurally similar to lower mirror structure 58, except that it is doped to have opposite polarity. That is, if lower mirror structure 58 is doped n-type, upper mirror structure 68 is then doped p-type. In addition, upper mirror structure 68 is formed to have a slightly reduced reflectivity as compared to lower mirror structure 58 for the reason that the optical emission is to be outcoupled therethrough. Typically, upper mirror structure 68 will have a reflectivity on the order of 98% to 99%.

On or above upper mirror structure layer 68 is second electrode 70. Second electrode 70 is typically formed of a chrome and gold bilayer, titanium, platinum, and gold trilayer, or other similar metal system. As previously discussed, since the material from which second electrode 70 is formed is typically opaque, second electrode 70 must provide a region through which the laser beam may exit the VCSEL structure. Second electrode 70 must have a large surface area contact with its contiguous underlying layer to provide minimal electrical resistance, yet be small enough to permit formation of high density arrays of VCSELs. Thus, second electrode 70 often has an annular, hollow elliptical or similar planform shape. Finally, since second electrode 70 is in contact with what has previously (and arbitrarily) been referred to as the p-type mirror, it is also referred to as the p-type electrode. Thus is presented an exemplary VCSEL according to one embodiment of the present invention.

VCSELs are ideally suited to integration into large numbers of nearly identical devices (arrays). Lithographic techniques and ion beam processing have yielded VCSELs with diameters below 1 micrometer. The accompanying reduction in the active volume of the VCSEL decreases driving threshold currents, and permits formation of large, complex structures of coherently coupled arrays. However, formation of such devices is processes dependent. One process for forming such VCSELs is ion implantation. Such a process is well known in the art (see, e.g., Morgan et al., IEEE Photonics Technology Letters, vol. 7, no. 5, 1995, and the references cited therein).

Formed atop (from the perspective of FIG. 2) VCSEL 52 is electronic circuitry layer 100. As will be appreciated, there are many variations of the topography, strata, and materials used to form layer 100. Furthermore, the number and type of components formed in layer 100 are a matter of design choice, and constrained principally by the area available in which they may be fabricated and the performance of the materials from which they are formed in light of the required component or system performance. Thus, it is particularly important that it be understood that the description contained herein is merely illustrative, and not in any way limiting as to the scope of the invention.

In addition, it is important to appreciate that VCSEL 52 and the component(s) formed in layer 100 may be formed of different materials. The material of the active layer 62 of VCSEL 52 has been defined as the predominant material from which VCSEL 52 is formed. Certain electronic components, such as transistors, also have active layers, and the material of such active layers is herein defined as the predominant material from which the component is formed. However, certain components do not have active layers as such. For such a component, the material comprising the greatest volume of the component, excluding the electrodes of such component, is defined herein as the predominant material from which such component is formed. Indeed, the difference in these materials may be a difference in alloys, difference in compositions, difference in crystal structures (e.g., single crystal, polycrystalline, and amorphous), etc.

Figure 2:
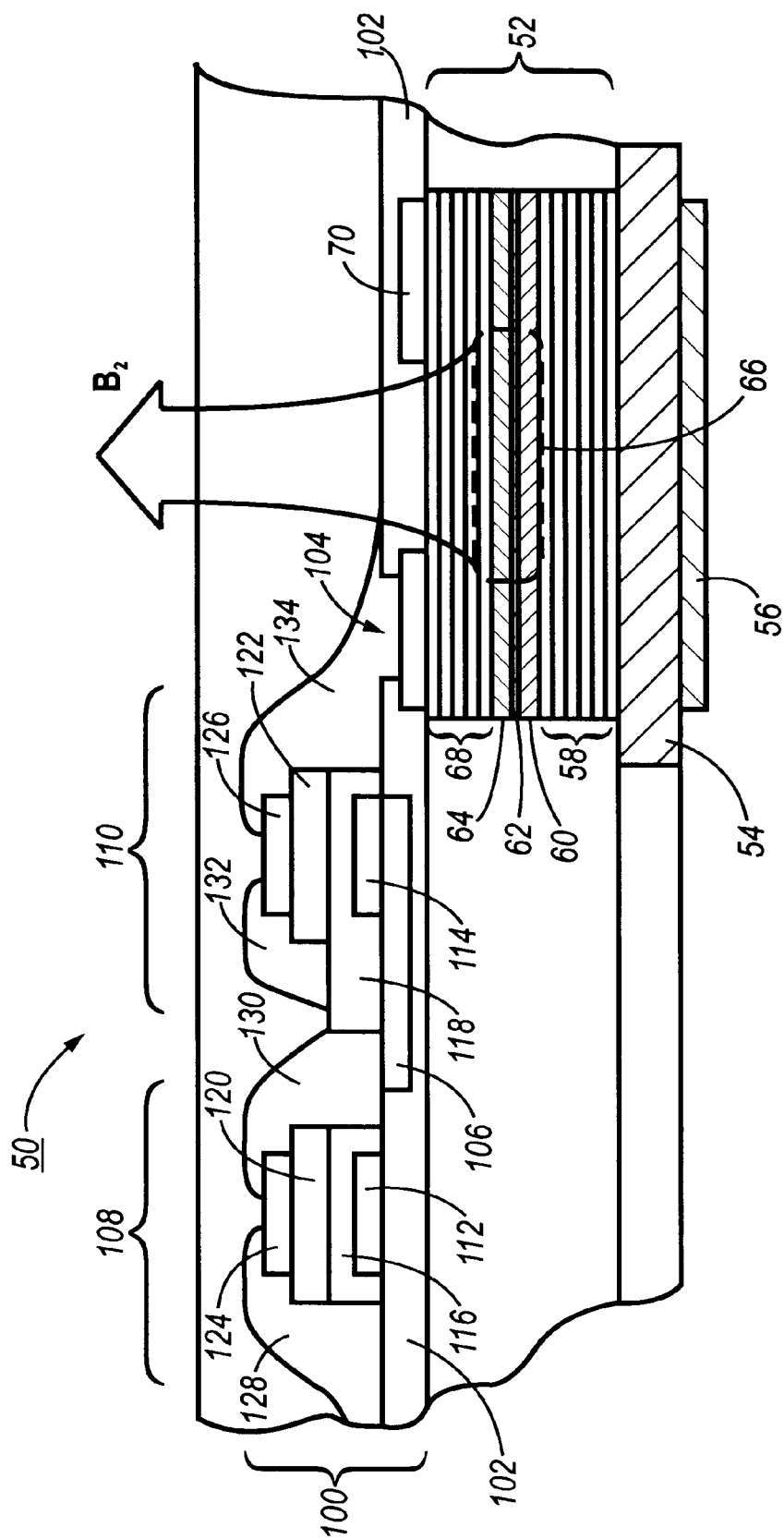
FIG. 2 is a cross-sectional view of an improved vertical cavity surface emitting laser structure and integrated detector structure according to the present invention.

In the embodiment shown in FIG. 2, a passivation layer 102 is deposited over the completed laser structure 52. Passivation layer 102 may either be transparent to light emitted by VCSEL 52, or have an opening formed therein (not shown) to allow the light emitted by VCSEL 52 to exit the structure. A conductive via 104 is formed in passivation layer 102 for subsequent electrical communication between the drain of a transistor structure and electrode 70. Additionally, a conductive region 106 is formed in passivation layer 102 for subsequent electrical communication between a gate of a first transistor structure and the drain of a second transistor structure, which will be described further below.

In the embodiment shown in FIG. 2, first and second transistor structures 108 and 110, respectively, are formed.

Each transistor structure is provided with a gate electrode, 112 and 114, respectively, formed of a metal such as aluminum. Over each gate electrode is insulating material 116 and 118. As illustrated, insulating material 118 extends to a width greater than the width of insulating material 116 in order to provide isolation between drain and source electrodes of the two transistor structures 108 and 110. Insulating material 116, 118 may typically be a nitride such as silicon nitride (SiN).

Channel material 120 and 122, comprised of a-Si:H, polysilicon or the like, is next deposited onto the insulating material 116, 118 respectively. If the channel material is comprised of a-Si:H, gate 114 must be relatively large to accommodate the large laser driving current. Passivation material 124, 126 is next deposited onto channel material 120, 122. Passivation material 124, 126 may typically be SiN, polymide, or other material well known to passivate and insulate the surface of channel material 120, 122.

The sources and drains of transistor structures 108 and 110 are next formed. Deposition and masking techniques otherwise well known in the art are employed to deposit isolated source 128 and drain 130 of first transistor structure 108, and source 132 and drain 134 of second transistor structure 110. Importantly, drain 130 is in electrical communication with gate 114 through conductive region 106, and drain 134 is in electrical communication with electrode 70 of the laser structure through conductive via 104.

The width to length ratio (w/l) of transistor 108 is chosen to obtain the desired current through the device. The current is also a function of the device material, with polysilicon providing a small w/l for a fixed current as compared to a-Si:H. For example, a peak performance VCSEL requires at least 10 microamps for drive current. By way of example only, the width to length ratio (w/l) of transistor 108 may be approximately 2 for a length of 8 to 10 micrometers (which is typical for polysilicon devices). Again, if the channel material is a-Si:H, w/l of transistor 110 should be rather larger, for example on the order of 10, for a length of between 8 and 10 micrometers. The relative sizes of these devices, however, are a matter of design choice based on many factors such as device performance requirements, VCSEL size, array density, materials used, etc., and should not be read as a limitation on the breadth of the invention hereof.

Figure 3:
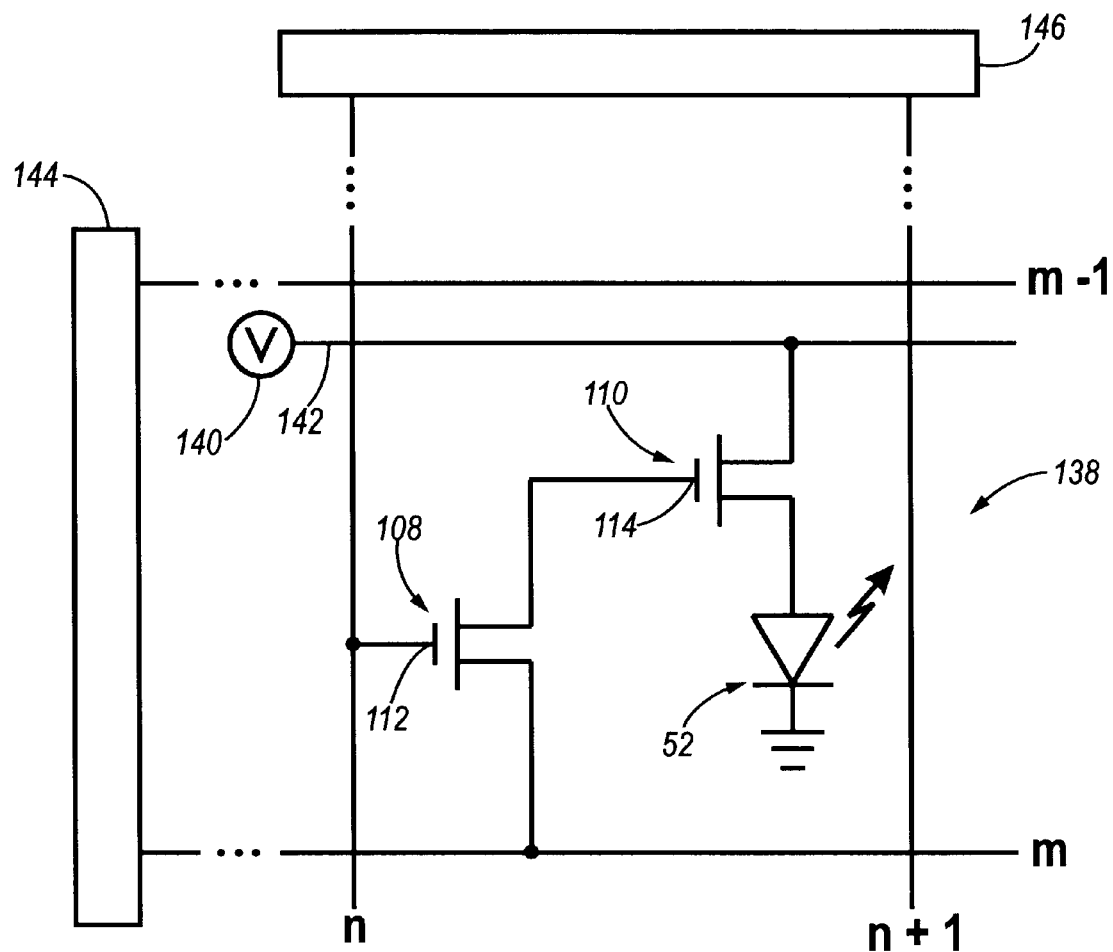
FIG. 3 is a schematic representation of one embodiment of an integrated laser and transistor structure.
Figure 4:
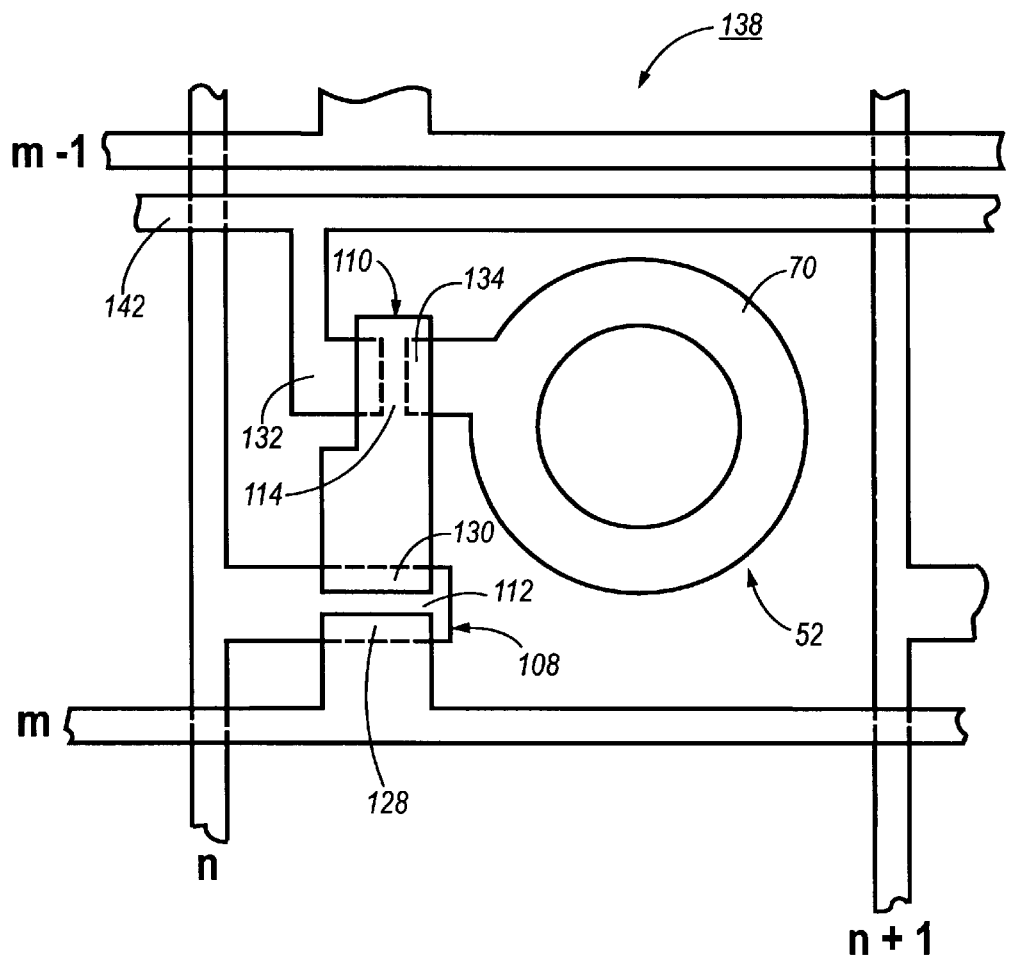
FIG. 4 is a plan view of one cell of an integrated laser and transistor structure used for addressing the laser corresponding to the schematic illustration of FIG. 3.

A schematic illustration of the device shown and described in FIG. 2 is shown in FIG. 3. Also, an illustrative plan view of the same device is shown in FIG. 4. Operation will be described with reference to each of these figures. While the aforementioned structure is a bottom gate structure (typical of a-Si:H devices), a top gate structure (typical of polycrystalline silicon devices) is completely within the scope of the present invention.

It will be assumed that cell 138 is one embodiment of integrated VCSEL and associated electronic components 50, and further that it is one of a number of such cells, arranged in an x-y matrix fashion, and that there are cells similar to cell 138 on each side and above and below cell 138. In the reference frame of cell 138, cells to the left and right of cell 138 are considered to be in the same row as cell 138, and cells to the top and bottom of cell 138 are considered to be in the same column as cell 138.

A voltage from voltage source 140 is applied to drive line 142 sufficient to drive VCSEL 52. This voltage is applied across all cells in the row of cell 138, and indeed may be applied simultaneously across all such cells in the array, leaving addressing of the individual cells to the following scheme.

Data line circuitry 144 selectively applies a voltage to all data lines m−1, m, etc. in the array. The voltage on each data line is either high or low depending on the desired state (ON or OFF) of the lasers in each row. Assume first that the desired state of VCSEL 52 is ON (i.e., emission of light). A voltage is applied to data line m, and consequently also applied to the source of transistor 108. Gate line circuitry 146 applies a voltage to gate line n to cause the channel of transistor 108 to be conductive. This results in application of the voltage from data line m to gate 114 of transistor 110, rendering its channel 122 conductive. Voltage is thereby applied to electrode 70 of VCSEL 52, causing initiation of the lasing process, and emission of a laser beam. If, however, the intended state of VCSEL 52 is OFF (i.e., no light emission), voltage is not applied to data line m, and consequently, no voltage flows to electrode 70.

The voltage on gate line n is then turned off. A new set of voltages is applied to the set of data lines, and a voltage is applied to gate line n+1. Selected VCSELs in the column connected to gate line n+1 are thereby caused to emit light. This process continues, stepping from one column to the next in sequential fashion. Coordination of the voltage levels on the data lines with the voltage on the gate lines allows addressing of individual VCSELs. This scheme may be employed for either two-state addressing (i.e., VCSEL being either on or off) or greyscale addressing by controlling the voltage on each data line, which in turn controls the current passing through the transistor between the VCSEL and the drive line.

Figure 5A:
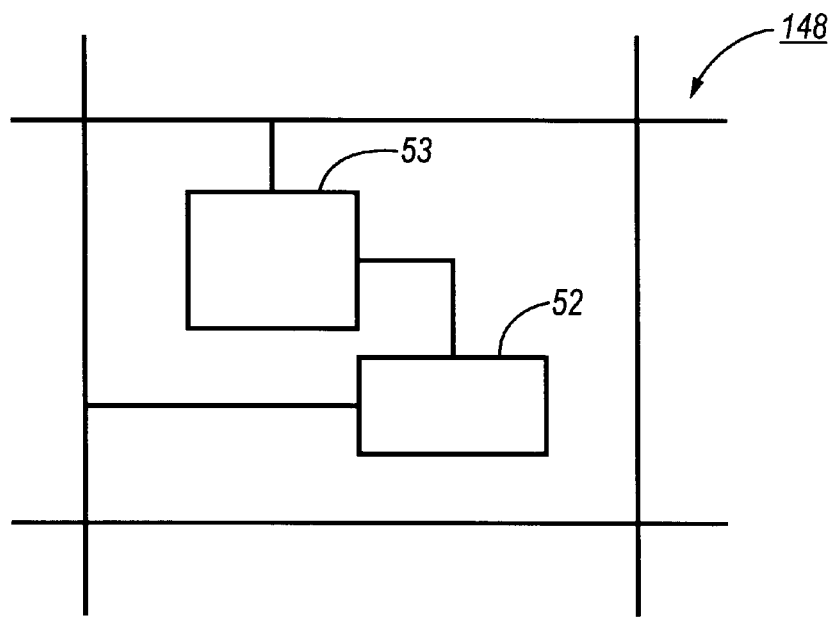
FIG. 5(*a*) and FIG. 5(*b*) show generic embodiments of the present invention.
Figure 5B:
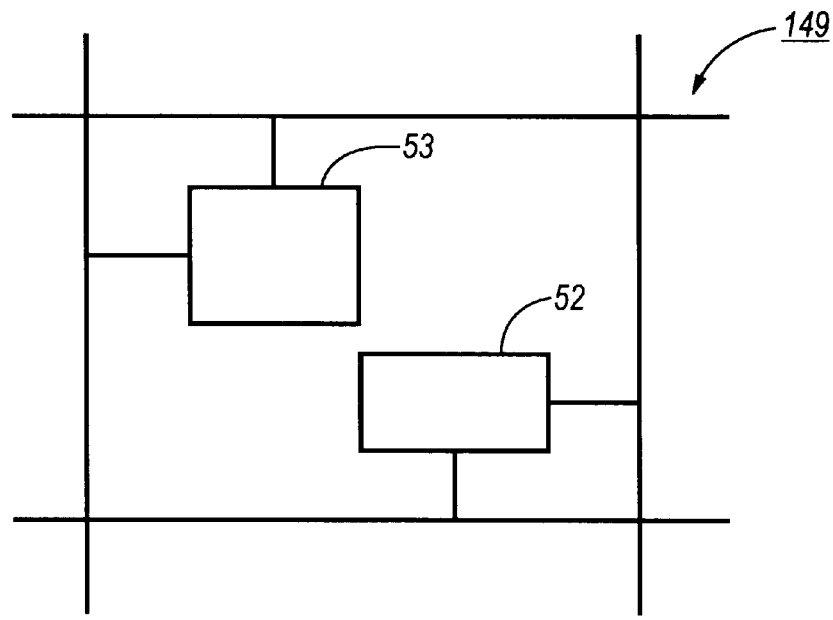

Additional embodiments and variations of the embodiment previously described are presented below. Points at which such additional embodiments and variations differ from that previously described will be highlighted. Each detail of the structure, however, shall not be repeated, it being understood that reference may be made to the previous discussion for specific details as needed. For example, FIG. 5(a) and FIG. 5(b) illustrate two generic embodiments of the present invention, each including a cell 148 and 149 respectively. In each embodiment, a VCSEL structure is paired with at least one electrical component 53. In the embodiment shown in FIG. 5(a), VCSEL 52 and electrical component 53 are electrically connected to one another. One example of this embodiment is an integrated VCSEL and addressing transistor. In the embodiment shown in FIG. 5(b), VCSEL 52 and electrical component 53 are electrically isolated from one another. One example of this embodiment is an integrated VCSEL and detector structure.

Figure 6:
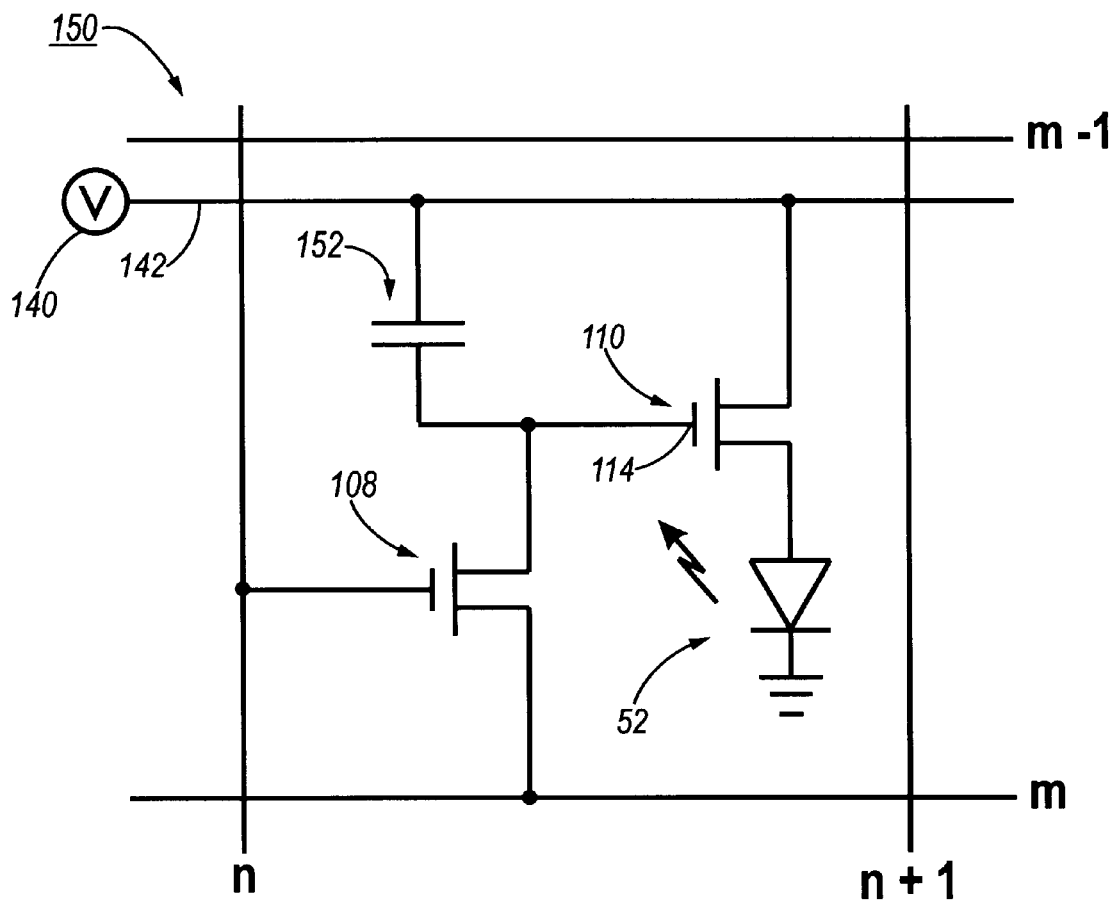
FIG. 6 is a schematic representation of another embodiment of an integrated laser and transistor structure.
Figure 7:
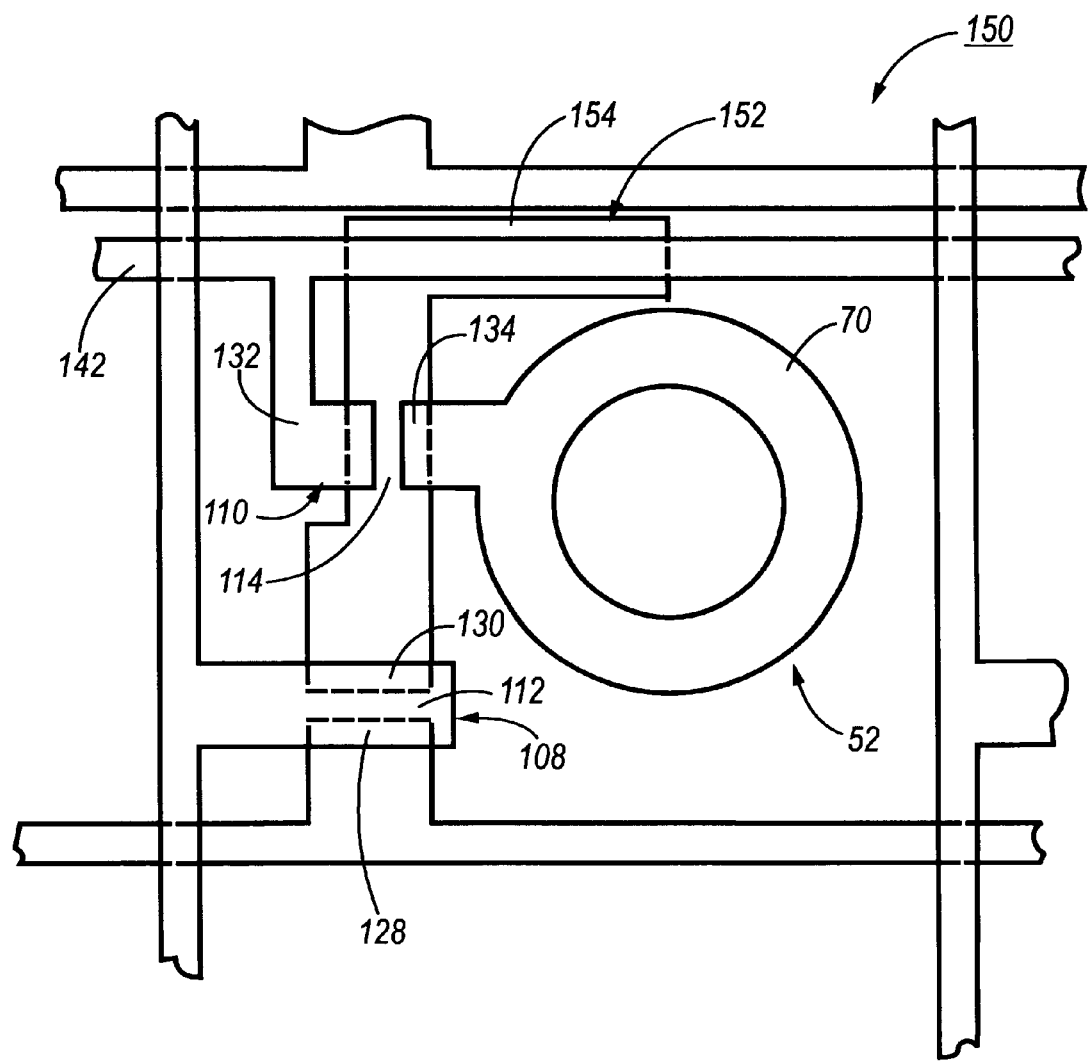
FIG. 7 is a plan view of one cell of an integrated laser and transistor structure used for addressing the laser, incorporating a capacitor structure, corresponding to the schematic illustration of FIG. 6.

FIGS. 6 and 7 illustrate a more specific embodiment of the present invention. In the schematic illustration of FIG. 6, cell 150 includes each of the transistors 108 and 110, as well as the VCSEL 52, of cell 138. However, added to this, a capacitor 152 is formed and connects gate 114 of transistor 110 and drive line 142. Referring to FIG. 7, capacitor 152 comprises an extension 154 of the gate contact material of transistor 110 which underlies part of drive line 142. An insulating material (not shown) between extension 154 and drive line 142 may be comprised of the material from which passivation layer 102 is formed. Capacitor 152 serves to maintain the gate voltage of transistor 110 to provide improved control of the VCSEL current, and render the device less susceptible to parasitic capacitance.

Figure 8:
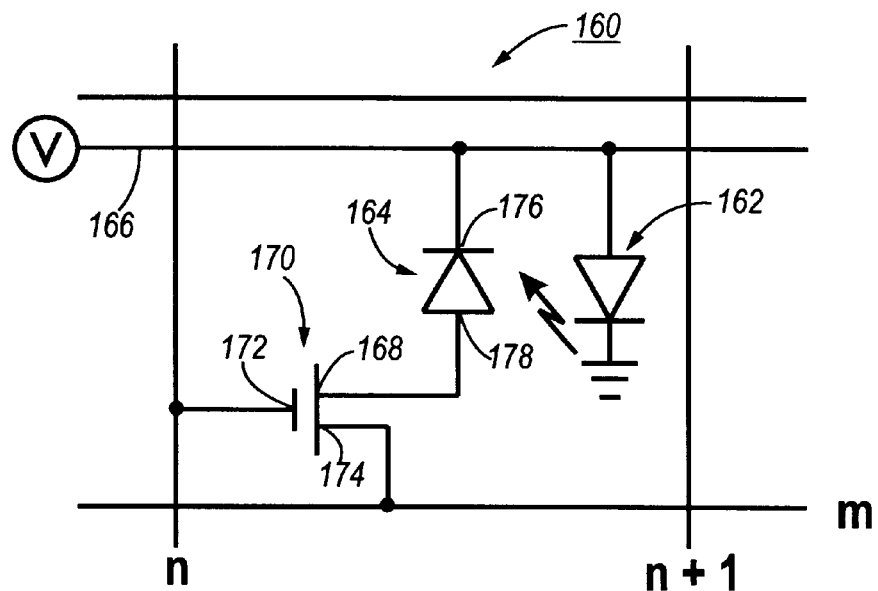
FIG. 8 is a schematic representation of one embodiment of an integrated laser and detector structure with a further integrated detector transistor structure.
Figure 9:
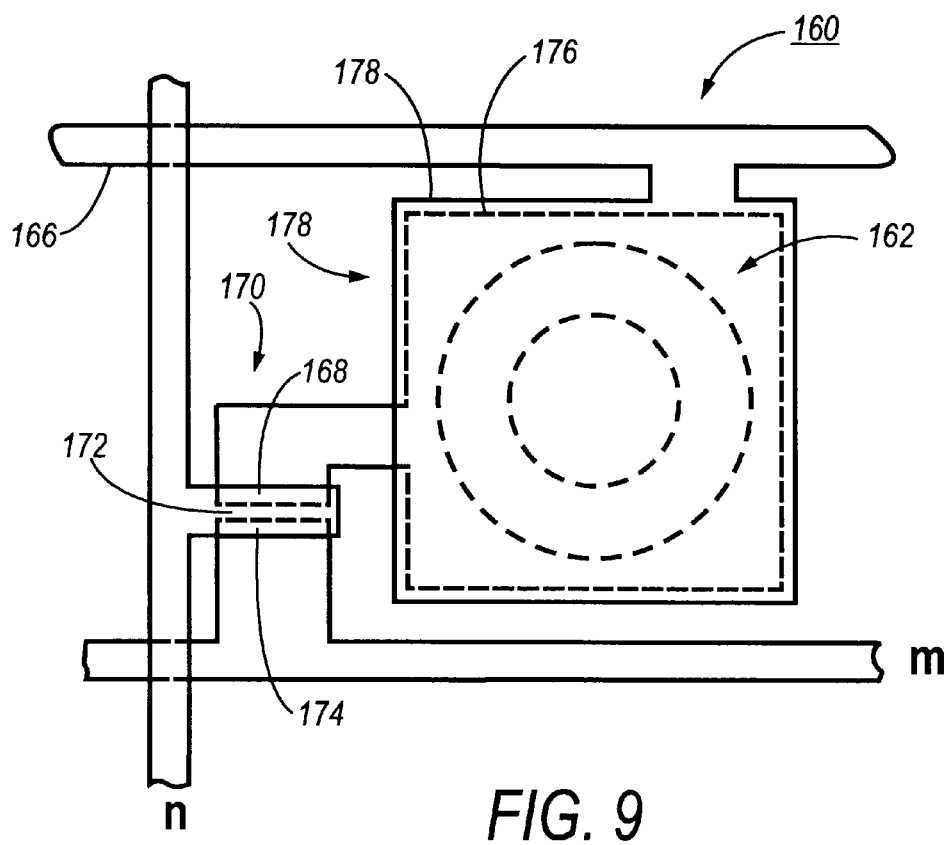
FIG. 9 is a plan view of one cell of an integrated laser and detector structure, including an integrated transistor structure used for addressing the sensor, corresponding to the schematic illustration of FIG. 8.

With reference now to FIGS. 8 and 9, there is shown therein another application of an integrated laser and transistor structure, with the addition of an integrated detector structure. According to this embodiment, a cell 160 is provided with a VCSEL structure 162 of the type previously described with regard to VCSEL 52. VCSEL 162 may be individually addressed (by means not shown) or may be addressed as a part of a group of collectively addressed lasers. A detector structure 164 is provided, which is connected to a drive voltage line 166, similar to the previous description of drive line 142.

Detector structure 164 is also connected to the source 168 of a transistor structure 170. The gate 172 of transistor 170 is connected to gate line n, and the drain 174 of transistor 170 is connected to data line m.

Figure 13:
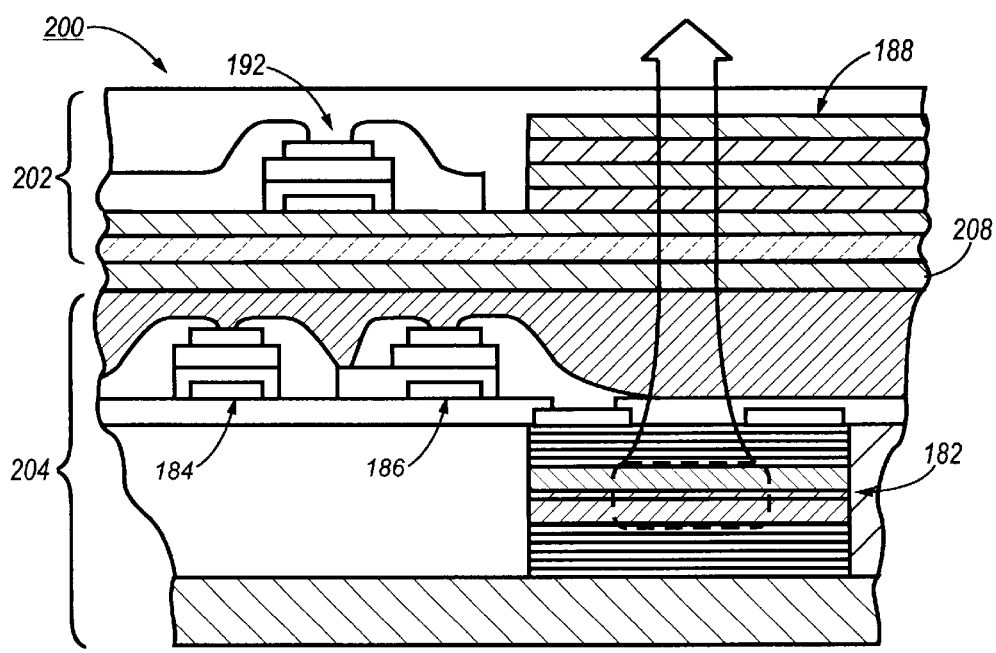
FIG. 13 is a cross section of one embodiment of the present invention in which a detector and transistor structure are formed on a glass substrate and bonded to an integrated laser and transistor structure.
Figure 14:
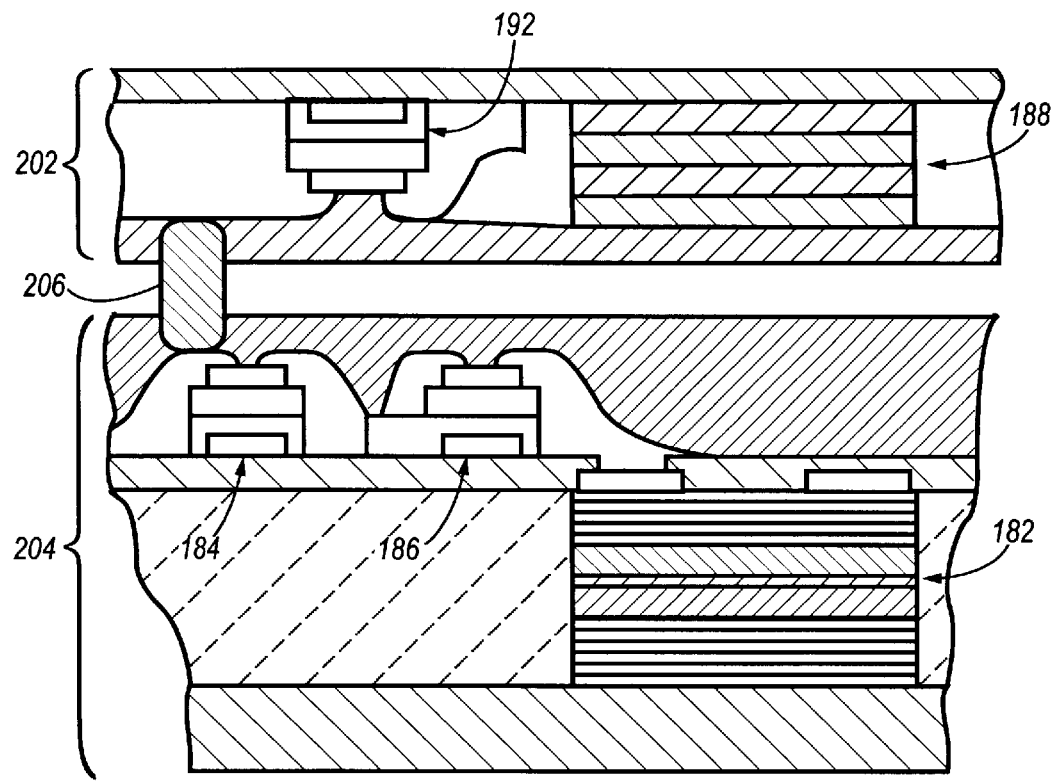
FIG. 14 is a cross section of one embodiment of the present invention in which a detector and transistor structure are formed on a glass substrate and bonded to an integrated laser and transistor structure, the laser and detector structures being in electrical communication with one another.
Figure 15:
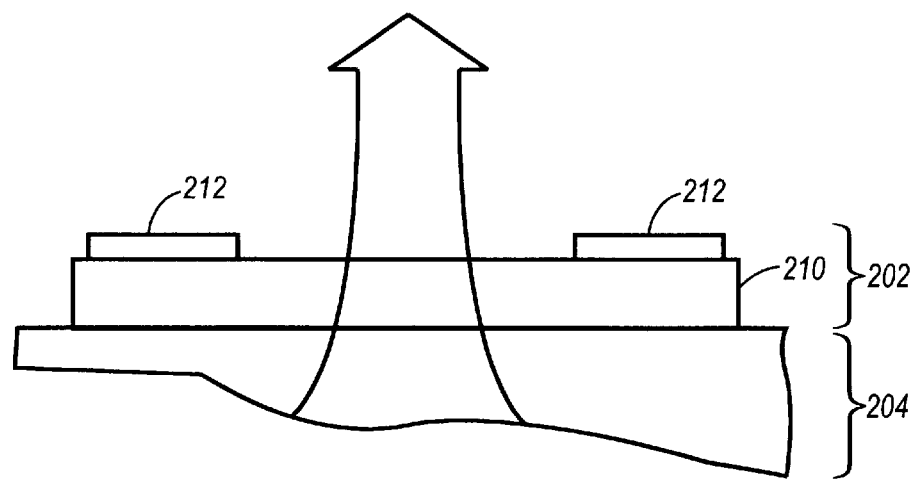
FIG. 15 is a cross-sectional view of another embodiment of the present invention employing a photoconductive layer as a component of an integrated detector.

Detector structure 164 may be any suitable detector such as a photodetector (e.g., photoconductive layer 210 and electrodes 212, shown in FIG. 15), a p-i-n photodiode with electrodes or the like (e.g., as shown in FIGS. 13 and 14). Detector structure 164 will typically be formed either directly on top of laser structure 162, or formed separately on a transparent substrate then bonded to the integrated laser and transistor structure such that a beam emitted by the laser is directed through the detector structure. Furthermore, in the present embodiment, detector 164 may be formed on transparent substrate together with a transistor structure, then bonded to a substrate in which a laser structure has been formed, as discussed further below.

It will be assumed for illustration that detector 164 is a p-i-n photodiode. Detector 164 will be provided with a first detector electrode 176, formed of a material both electrically conductive and transparent to light at the wavelength of the emission of laser 162. An example of an appropriate material for first detector electrode 176 is indium tin oxide (ITO). First detector electrode 176 may be on the order of 1000 Å thick.

Formed on or above first detector electrode 76 is a layer of doped hydrogenated amorphous silicon (a-Si:H) (not shown), which is for the most part transparent to light at the wavelength of laser 162. In one embodiment, the a-Si:H layer is doped p+. Formed on or over the doped a-Si:H layer is an intrinsic a-Si:H. It is in this layer that the incident light generates electron-hole pairs by means well known in the art to enable detection and quantification of the light passing therethrough. Formed on or above the intrinsic a-Si:H layer is another doped a-Si:H layer, which is for the most part transparent to light at the wavelength of VCSEL 162, and which is doped n+. Finally, formed on or above the n+ doped a-Si:H layer is upper detector electrode 178. The structure and composition of upper detector electrode 178 is the same as that of lower detector electrode 176. For example, upper detector electrode 178 may be formed of ITO, and may be on the order of 1000 Å thick.

Thickness and composition of an a-Si:H film may be chosen to provide the desired absorption of, for example, about 5%. The a-Si:H can be alloyed with germanium or carbon, as well known in the art, to obtain desired absorption. Long wavelength absorption (for detectors to be employed with long wavelength lasers) may be obtained from a-Si:Ge:H, while short wavelength absorption (for detectors to be employed with short wavelength lasers) may be obtained from a-Si:C:H.

Also as well known in the art, a-Si:H and its alloys can be deposited by plasma enhanced chemical vapor deposition (PECVD). Source gases include $SiH_4$, $GeH_4$, $CH_4$, etc.

An example of the operation according to this embodiment proceeds as follows. A bias is applied to laser 162 to cause emission of a laser beam (not shown). The power of the laser beam will be detected by detector structure 164, for example by measuring the bias between detector electrodes 176 and 178 resulting from the beam's generation of electron-hole pairs in the intrinsic layer.

Individual addressing of the detector according to this embodiment is facilitated by the transistor structure 170 integrally formed with laser 162. For example, a voltage is applied to gate line n to turn ON (render conductive) transistor 170. The state of detector structure 164, for example a measure of the optical power of the laser beam emitted by laser 162, may be determined for cell 160 by examining the voltage level of data line m.

One example of the use of such power information is feedback loop control of the laser driving current by appropriate hardware and/or software (not shown). For example, the optical power of this laser beam is in part a function of the level of the driving current. Should detector structure 164 indicate that the beam power is below a desired level, the driving current may be caused to increase, and similarly, should detector structure 164 indicate that the beam power is above a desired level, a decrease in the driving current may be effected.

Information regarding the optical power of the laser beam may be employed in other ways, for example, to measure the aging of laser 162 to anticipate its need for replacement, to distinguish between various possible output states of the laser 162 such as in communications systems, etc. Importantly, the novel structure taught hereby is not limited by its use, and the benefits of such structure extend across may fields of application.

Importantly, in detecting the power of the laser beam, detector structure 164 only minimally attenuates the power of the beam, and since it is transparent, its physical dimensions are not governed by either the laser structure's electrode size and shape nor by the laser beam's diameter.

Figure 10:
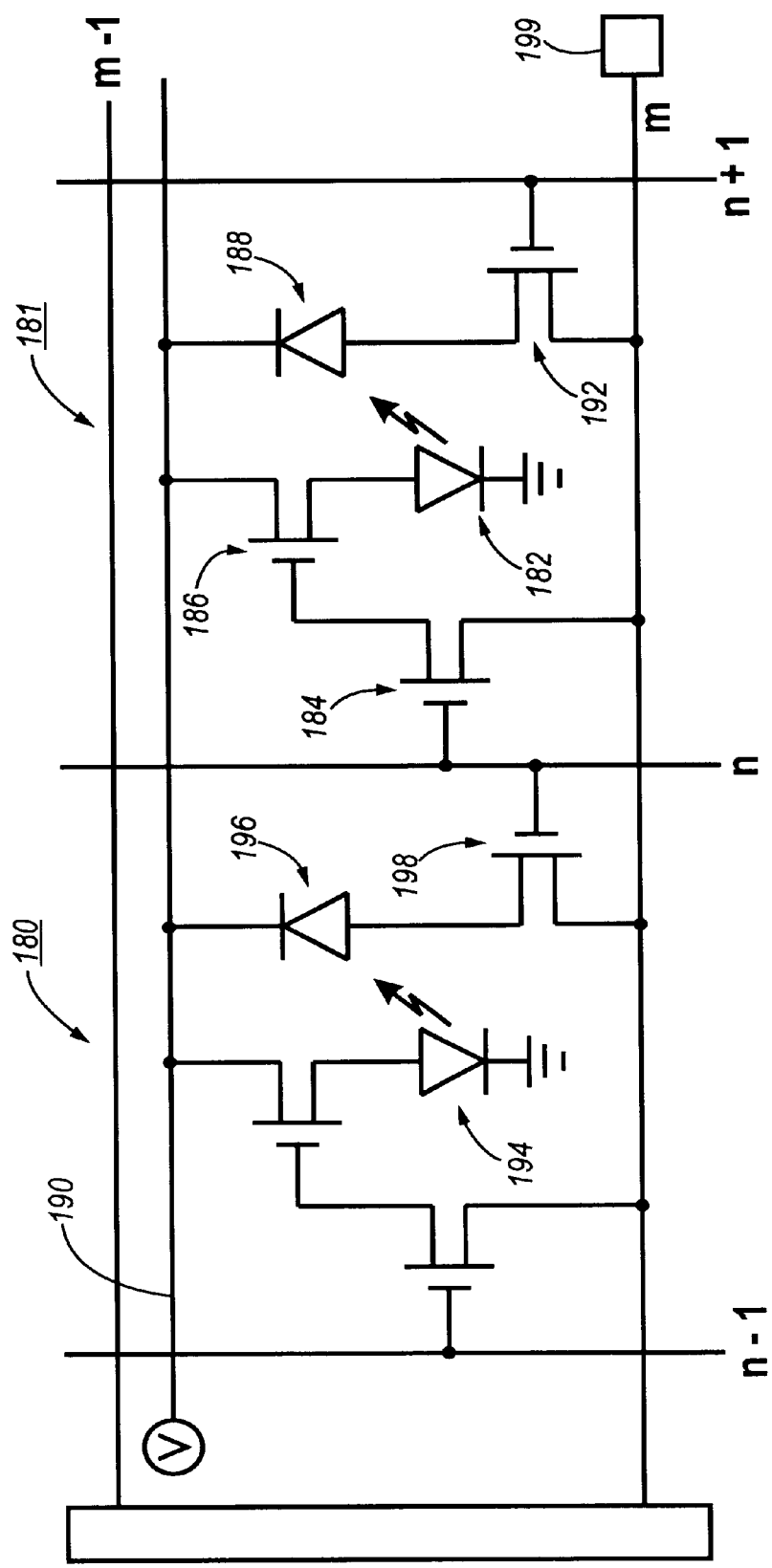
FIG. 10 is a schematic representation of another embodiment of an integrated laser and detector structure with integrated laser and detector transistor structures.
Figure 11:
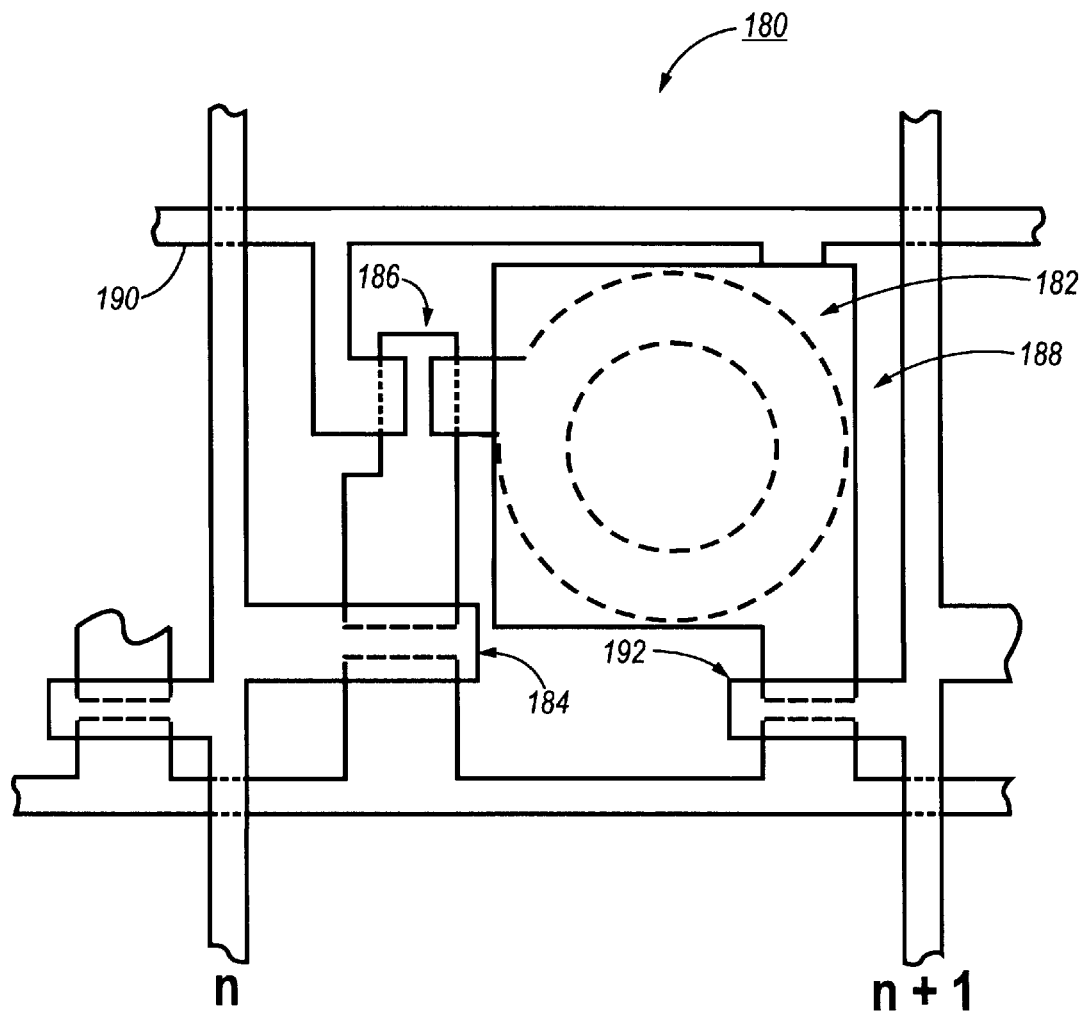
FIG. 11 is a plan view of one cell of an integrated laser and detector structure including integrated transistor structures used for separately addressing the laser and detector corresponding to the schematic illustration of FIG. 10.

With reference now to FIGS. 10 and 11, there is shown therein another application of an integrated laser and transistor structure, with the addition of an integrated detector structure. According to this embodiment, a cell 181 is provided with a VCSEL structure 182 of the type previously described with regard to VCSEL 52. In this embodiment, VCSEL 182 may be individually addressed by transistor elements 184 and 186 in the manner previously described. A detector structure 188 is provided, which is connected to a drive voltage line 190 and a transistor structure 192, similar to the previous description of the embodiment shown in FIGS. 8 and 9. Also shown in FIG. 10 is a cell 180 adjacent to cell 181, which may, for example, include components similar to those of cell 181, specifically including a VCSEL 194, a detector structure 196, and associated transistor 198.

Operation of the embodiment shown in FIGS. 10 and 11 proceeds as follows. A voltage applied to drive voltage line 190 is applied to laser 194 when gate line n−1 is enabled, as previously described. The laser beam thereby emitted by laser 194 is detected by detector 196. The same process then takes place for cell 181. However, upon applying a voltage to gate line n, the channel of transistor 198 is made conductive, and the state of detector 196 may be read on data line m, which may be distinguished from the data voltage on line m by means 199. In essence, current through detector 196 is first measured from, then voltage for driving VCSEL 182 is applied to data line m.

Figure 12:
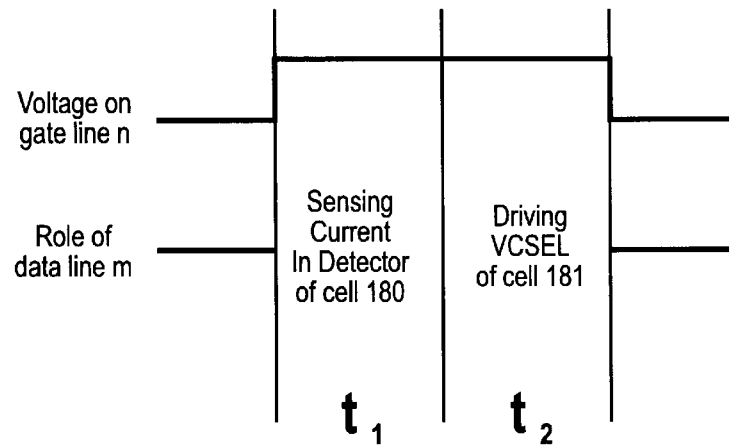
FIG. 12 is a timing diagram showing various voltages for the cell of an integrated laser and detector structure including integrated transistor structures used for separately addressing the laser and detector corresponding to the schematic illustration of FIG. 10 and plan view of FIG. 11.

FIG. 12 shows a timing diagram tracking the above description in the case where a detector in a first cell has detected the emission of light from a VCSEL in its cell, and where the VCSEL in an adjacent cell is to emit light. While a voltage is applied to gate line n, for example for a period of 20 $\mu$sec, the state of detector 196 may be read on data line m for time $t_1$. Before the termination of the application of voltage on gate line n, a laser switching voltage is applied to data line m during time $t_2$.

As previously mentioned, in another embodiment 200 of the present invention, detector structure 188 and its associated transistor structure 192 may be formed separately from the integral formation of laser structure 182 and transistor structures 184 and 186. For example, detector structure 188 and transistor structure 192 may be formed and electrically connected to one another on a transparent substrate such as glass, quartz, etc., forming a detector subassembly 202. A laser structure 182 may be integrated with transistor structures 184 and 186 to form a laser subassembly 204. Detector subassembly 202 may then be bonded to laser subassembly 204 using a transparent epoxy or similar adhesive 206. This is illustrated in FIG. 13. While the embodiment shown in FIG. 13 has the substrate of detector subassembly 202 bonded to the upper surface of laser subassembly 204, similar results may be obtained by inverting the detector subassembly 202 then bonding it to the laser subassembly 204. Indeed, since the laser beam may diverge in passing through the transparent substrate, in order to maximize the packing density of VCSELs in an array of such devices, this inverted attachment may be beneficial.

As illustrated in FIG. 14, bump bonding may be employed to join the two otherwise independent subassemblies 202 and 204 into a single, integrated structure. Detector subassembly 202 would typically be inverted in this embodiment so that it may be in electrical contact with laser subassembly 204 via conductive bonding bumps 206 formed, for example, of indium/gold, or other well known suitable materials. Any gap between detector subassembly 202 and laser subassembly 204 will typically be filled with air. Devices for performing such bump bonding are well known in the art, for example SEC Model 410 Flip Chip Die Bonder from Semiconductor Equipment Corporation, Moorpark, Calif.

One advantage of this embodiment of the present invention is the ability to independently fabricate each of the laser structure 182 and the detector structure 188, allowing use of optimized fabrication techniques for each. In addition, the independent fabrication of each structure allows for isolation of the manufacturing steps, which eliminates any risk of damaging one structure during or as a result of the fabrication of the other structure. Independent testing of each of the laser and detector structures also allows for improved yield by early identification of malfunctioning components.

One variation of the aforementioned embodiment is the partial completion of detector subassembly 202, the bonding of detector subassembly 202 to the completed laser subassembly 204, and the subsequent completion of the formation of the detector subassembly. This may be advantageous where, for example, it is desirable to complete the formation of the integrated structure in the form of a single substrate array, or where it is desirable for one party to complete fabrication of the device up to one point, then deliver a partially completed structure over to a second party to complete the fabrication.

While the invention has been described in terms of a number of specific embodiments, it will be evident to those skilled in the art that many alternatives, modifications, and variations are within the scope of the teachings contained herein. For example, the above descriptions have been in terms of arrays of laser and transistor structures. However, the above description applies equally to individual laser and transistor structures. Accordingly, the present invention should not be limited by the embodiments used to exemplify it, but rather should be considered to be within the spirit and scope of the following claims, and equivalents thereto, including all such alternatives, modifications, and variations.

What is claimed is:

1. An integrated semiconductor laser and component structure, comprising:
    a vertical cavity, surface emitting laser, which is formed over a substrate and which has an active layer which comprises gallium, said vertical cavity surface emitting laser capable of emitting light at a wavelength; and
    at least one electronic component which is disposed over said substrate and which comprises silicon.

2. The integrated semiconductor laser and component structure of claim 1, wherein said electronic component and said laser are in electrical communication with one another.

3. The integrated semiconductor laser and component structure of claim 2, wherein said electronic component is a transistor.

4. The integrated semiconductor laser and component structure of claim 2, wherein said at least one electronic component is formed over said substrate.

5. The integrated semiconductor laser and component structure of claim 4, wherein said at least one electronic component shares a common layer with said vertical cavity, surface emitting laser.

6. The integrated semiconductor laser and component structure of claim 3, further comprising a capacitor disposed over said substrate.

7. An integrated semiconductor laser and component structure, comprising:
    a vertical cavity, surface emitting laser, which is formed over a substrate and which has an active layer which is comprised predominantly of a first material, said vertical cavity surface emitting laser capable of emitting light at a wavelength; and
    at least one electronic component which is comprised predominantly of a second material different than said first material being formed over said substrate and sharing a common layer with said laser, said laser and said electronic component being in electrical communication with one another.

8. An integrated semiconductor laser and component structure, comprising:
    a vertical cavity, surface emitting laser, which is formed over a substrate and which has an active layer which is comprised predominantly of a first material, said vertical cavity surface emitting laser capable of emitting light at a wavelength;
    at least one electronic component which is comprised predominantly of a second material different than said first material, said laser and said electronic component being in electrical communication with one another;
    a detector comprising a photodetector layer and contacts, said photodetector layer being relatively transparent to light at the wavelength emitted by said laser; and
    said laser and said detector being contiguous and aligned such that at least a portion of the light emitted by the laser is directed through the photodetector layer.

9. The integrated semiconductor laser and component structure of claim 8, wherein said photodetector layer is integrally formed with said laser over said substrate.

10. The integrated semiconductor laser and component structure of claim 8, wherein said photodetector layer is a multi-layer p-i-n photodetector.

11. The integrated semiconductor laser and component structure of claim 10, wherein at least one of said contacts is transparent at the wavelength emitted by said laser, and further wherein at least a portion of the light emitted by the laser is directed through said at least one transparent contact.

12. The integrated semiconductor laser and component structure of claim 10, wherein the multi-layer p-i-n photodetector is comprised of doped layers of hydrogenated amorphous silicon.

13. The integrated semiconductor laser and component structure of claim 11, wherein the at least one transparent contact is comprised of indium tin oxide.

14. The integrated semiconductor laser and component structure of claim 8, wherein said second material is selected from the group comprising amorphous materials and polycrystalline materials.

15. An integrated semiconductor laser and component structure, comprising:

a vertical cavity, surface emitting laser, which is formed over a substrate and which has an active layer which is comprised predominantly of a first material, said vertical cavity surface emitting laser capable of emitting light at a wavelength;

at least one electronic component which is comprised predominantly of a second material different than said first material, said laser and said electronic component being in electrical communication with one another;

a detector comprising a photodetector layer and contacts, said photodetector layer being relatively transparent to light at the wavelength emitted by said laser; and said laser and said detector being separately fabricated and bonded together, and aligned such that at least a portion of the light emitted by the laser is directed through the detector.

16. The integrated semiconductor laser and component structure of claim 15, further comprising:

at least one transistor integrally formed with said detector, and in electrical communication with said detector.

17. The integrated semiconductor laser and component structure of claim 15, wherein said at least one transistor integrally formed with said detector and said at least one electronic component are in electrical communication with one another.

\* \* \* \* \*